(12) United States Patent
Eugene Lee et al.

(10) Patent No.: US 9,842,807 B2
(45) Date of Patent: Dec. 12, 2017

(54) INTEGRATED CIRCUIT ASSEMBLY

(71) Applicant: Texas Instruments Incorporated, Dallas, TX (US)

(72) Inventors: Lee Han Meng@ Eugene Lee, Johor (MY); Anis Fauzi bin Abdul Aziz, Kedah (MY); Wei Fen Sueann Lim, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/887,047

(22) Filed: Oct. 19, 2015

(65) Prior Publication Data
US 2017/0110408 A1    Apr. 20, 2017

(51) Int. Cl.
| H01L 23/538 | (2006.01) |
| H01L 23/495 | (2006.01) |
| H01L 21/768 | (2006.01) |
| H01L 21/56 | (2006.01) |
| H01L 21/48 | (2006.01) |
| H01L 21/78 | (2006.01) |

(52) U.S. Cl.
CPC ...... *H01L 23/5386* (2013.01); *H01L 21/4853* (2013.01); *H01L 21/563* (2013.01); *H01L 21/565* (2013.01); *H01L 21/76898* (2013.01); *H01L 21/78* (2013.01); *H01L 23/4952* (2013.01); *H01L 23/49503* (2013.01); *H01L 23/5384* (2013.01); *H01L 2224/48091* (2013.01); *H01L 2224/48247* (2013.01); *H01L 2224/48257* (2013.01); *H01L 2224/48464* (2013.01); *H01L 2224/49171* (2013.01)

(58) Field of Classification Search
CPC .......... H01L 23/5386; H01L 23/49503; H01L 23/5384; H01L 21/76898; H01L 23/4952; H01L 21/565; H01L 21/563; H01L 21/4853; H01L 21/07; H01L 23/66; H01L 2924/30107; H01L 21/76224
See application file for complete search history.

(56) References Cited

U.S. PATENT DOCUMENTS 8,598,713 B2 * 12/2013 Blaschke .............. H01L 21/743
257/774

\* cited by examiner

*Primary Examiner* — Roy Potter
(74) *Attorney, Agent, or Firm* — Jacqueline J. Garner; Charles A. Brill; Frank D. Cimino

(57) ABSTRACT

An integrated circuit (IC) die including a top surface and a bottom surface, a plurality of spaced apart ground connection traces positioned between the top surface and the bottom surface; with a hole in the die exposing the plurality of spaced apart ground connection traces.

20 Claims, 5 Drawing Sheets

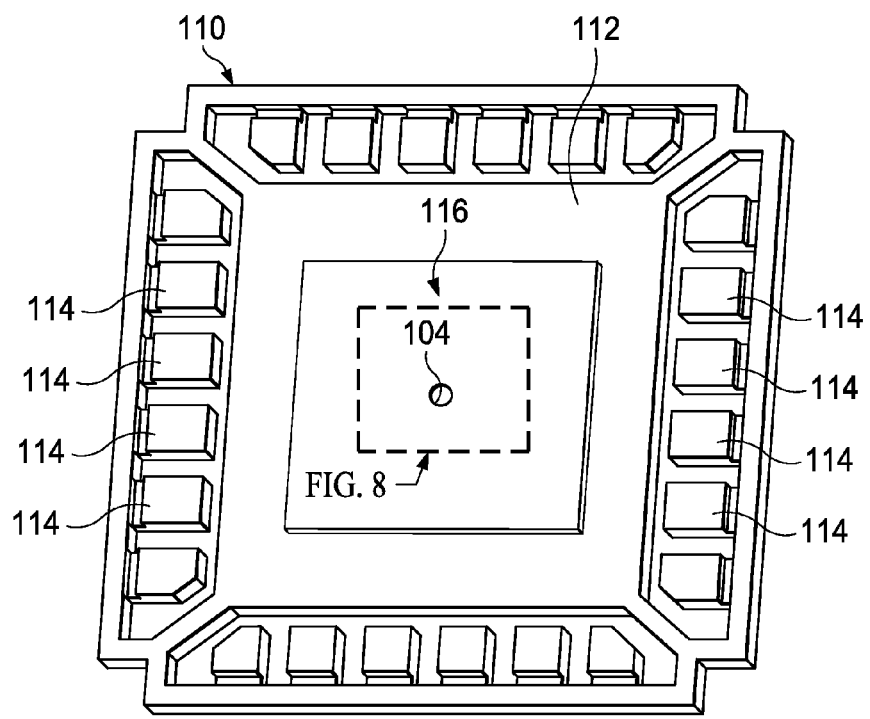
FIG. 7
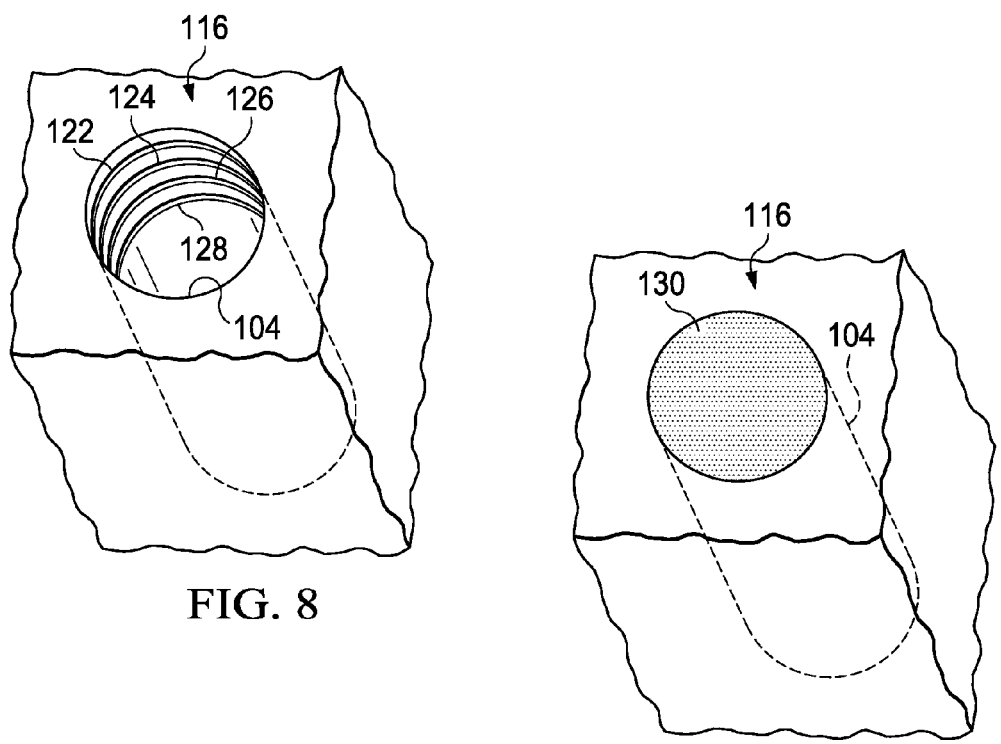
FIG. 8
FIG. 9

301 — EXPOSING GROUND CONNECTION TRACES IN AN IC DIE BY MAKING A HOLE IN THE DIE THAT INTERSECTS THE GROUND CONNECTION TRACES

401 — PROVIDING A PLURALITY OF STACKED GROUND CONNECTION TRACES AT A CENTRAL PART OF A DIE

402 — FORMING A HOLE THROUGH THE DIE TO EXPOSE THE GROUND CONNECTION TRACES

INTEGRATED CIRCUIT ASSEMBLY

BACKGROUND

Integrated circuit ("IC") chips/dies, to be useful, must be electrically connected to one another or to other electronic components. Leadframes made from conductive metal such as copper, silver or gold are often used to electrically connect an IC die to other electronic components. One popular and flexible method of connecting IC dies to leadframes is wire bonding. Bond wires usually consist of aluminum, copper or gold. Bond wire diameters typically range from about 15 µm to several hundred µm in high-power applications. There are two basic types of wire bonding—ball bonding and wedge bonding.

Ball bonding is usually performed with a combination of heat, pressure and ultrasonic energy. In ball bonding, a small molten ball is formed at the end of the bond wire by application of a high voltage charge through a tool known as a capillary that holds and dispenses wire. The molten ball is placed on an electrical contact surface of a chip. The contact surface is usually copper or aluminum. A combination of heat, pressure and ultrasonic energy is then applied which creates a weld between the ball and the contact surface. The ball bond is sometimes referred to as the first bond because it is usually the first bond made in wire bonding of an IC die to a leadframe.

In a die-leadframe interconnection, the type of wire bond that is generally used to connect the second end of the bond wire to the leadframe is called a wedge bond or sometimes second bond. It is formed by crushing the end of the bond wire between the leadframe or other metal surface and the tip of the capillary tool while the connection region is heated. Wedge bonding also called as stitch bonding) when performed on a die attachment pad (DAP) can cause an attached die to delaminate from the DAP.

SUMMARY

An integrated circuit (IC) die that includes a plurality of spaced apart ground connection traces positioned between a top surface and bottom surface of the die with a hole in the die that exposes the plurality of spaced apart ground connection traces. An assembly provided by filling the hole with conductive material and attaching the die to a leadframe with no bond wires attached to the die attachment pad and a method of making it is also described.

BRIEF DESCRIPTION OF THE DRAWING

FIG. 7 is a top plan view of a lead frame with one of the singulated dies of FIG. 6 mounted on a die attachment pad of the lead frame.

FIG. 8 is a magnified isometric view of a portion of the die of FIG. 7 in which a hole is drilled.

FIG. 9 is the magnified view of FIG. 8 after the hole has been filled with conductive material.

DETAILED DESCRIPTION

Figure 1:
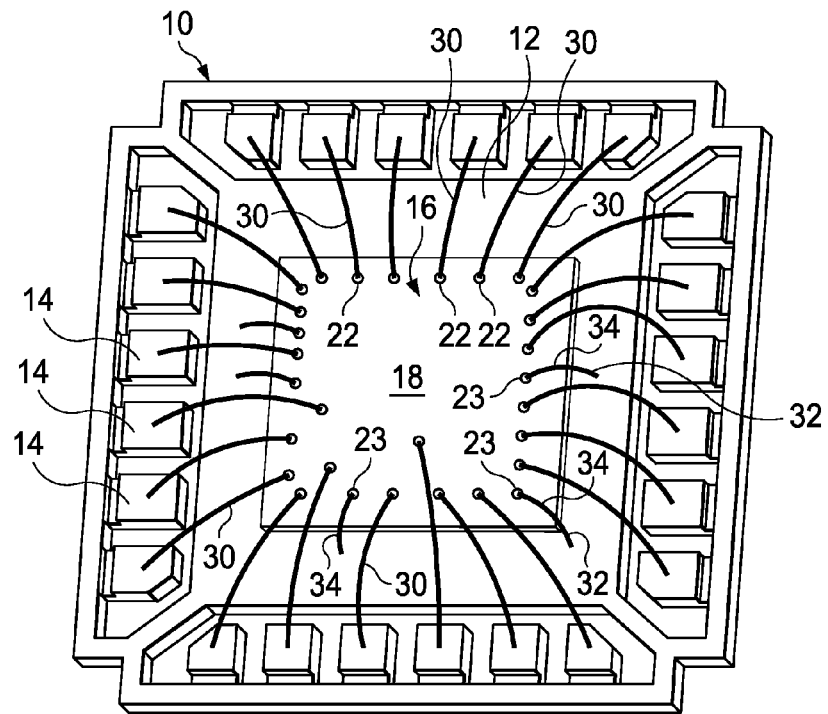
FIG. 1 is a top plan view of a prior art die and lead frame assembly.

FIG. 1 is a top plan view of a prior art die and lead frame assembly. A lead frame 10 has a die attachment pad (DAP) 12 and a plurality of leads 14. A die 16 is mounted on the DAP 12. The die 16 has a top surface 18, which includes a plurality of die electrical contact surfaces 22. A first plurality of bond wires 30 are ball bonded to die contact surfaces 22 at first ends thereof and are stitch bonded to leads 14 at the second ends thereof. A second plurality of bond wires 32 are ball bonded to certain die contact surfaces 23 that are connected with ground traces within the die 16. The opposite ends of these wires 32 are stitch bonded to the DAP 12.

"Wire sweep" refers to an IC package manufacturing problem that occurs when bond wires are not properly aligned in the horizontal plane. Wire sweep can occur during the wire bonding process, during handling after wire bonding, or during molding. Wire sweep can affect electrical performance by changing the mutual inductance of adjacent wires and SSN (simultaneous switching noise). If the wires touch, they will short. Another problem associated with wire bonding is that the stitch bonds formed on a die attach pad (DAP) can cause a die mounted on the DAP to delaminate from it.

Figure 2:
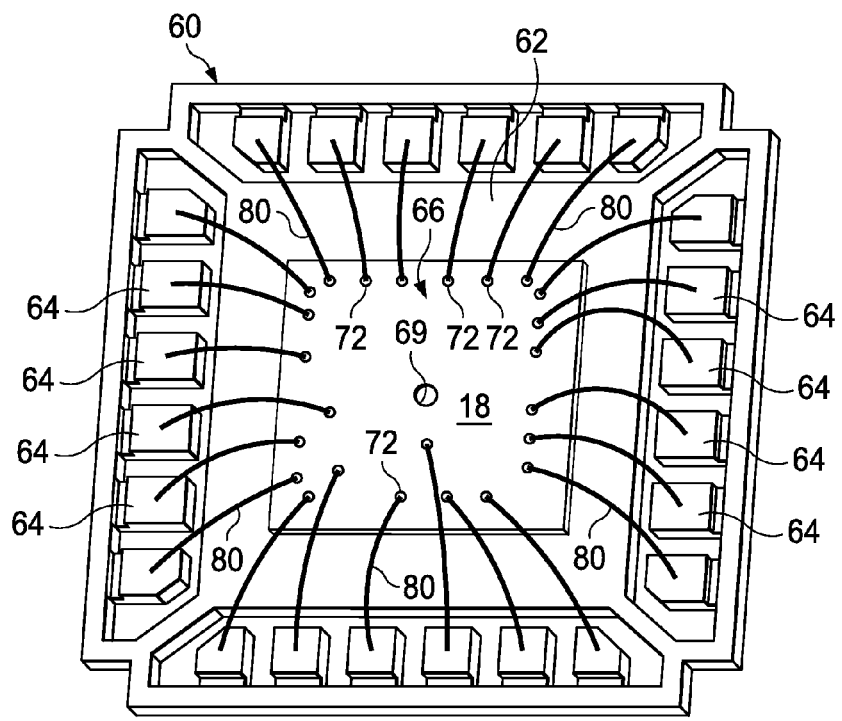
FIG. 2 is a top plan view of a die and lead frame assembly.

Applicants have developed a die that eliminates the need for bond wires electrically connected to the ground traces. A die/leadframe assembly including such a die 66 mounted on a DAP 62 of a leadframe 60 is illustrated in FIG. 2. Bond wires 80 connect die contact surfaces 72, which are not connected to ground traces, to leads 64. These bond wires 80 are connected only to the leadframe leads 64, not the DAP 62. The ground traces in the die are electrically connected to the DAP 62 through conductive filler material 68 filling a hole 69 extending through the die 66. The conductive material 68 is exposed at the bottom of the die 66. Ground traces (not shown in FIG. 2) within the die 66 electrically contact the conductive filler material 68.

A die 116, which may be similar or identical to die 66, and a method by which this die 116 is produced and mounted on a leadframe are described in detail with reference to FIGS. 3-9 below. The elimination of bond wires connecting ground traces in a die to a DAP reduces the risk of wire sweep. This reduction in bond wires connected to a DAP effectively increases the space between the remaining bond wires. Removal of bond wires attached to the DAP obviates wire stitching on the DAP, and the problem of die/DAP delamination caused by wire stitching.

Figure 3:
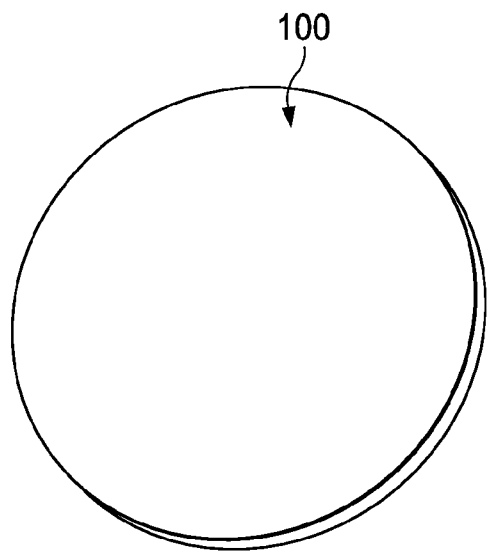
FIG. 3 is a top plan view of a die wafer at an initial stage of a new die fabrication process disclosed herein.

FIG. 3 is a top plan view of a die wafer 100 after wafer fabrication.

Figure 4:
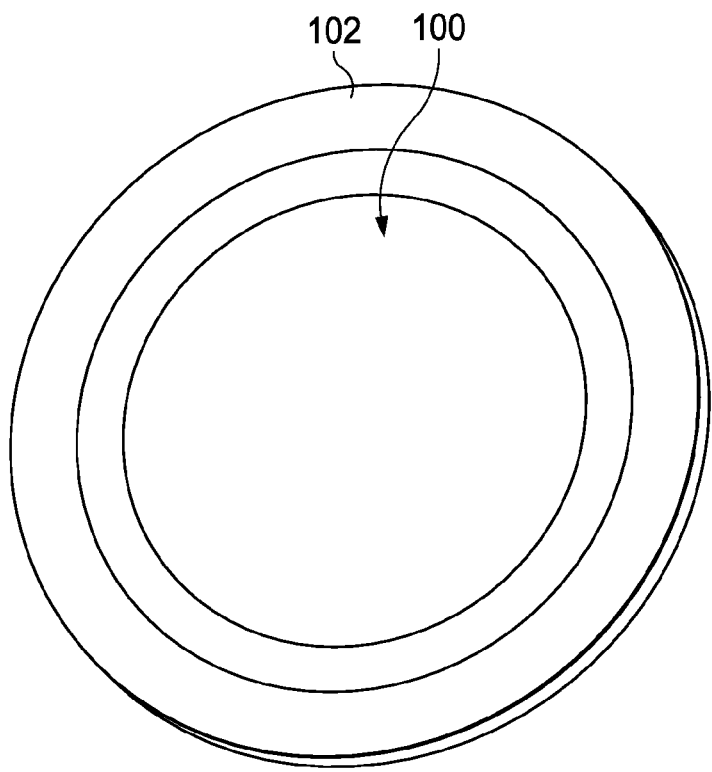
FIG. 4 is a top plan view of a die wafer mounted on a wafer ring at another stage of the new die fabrication process disclosed herein.

FIG. 4 is a top plan view of the die wafer 100 of FIG. 1 mounted on a conventional wafer ring 102 for processing.

Figure 5:
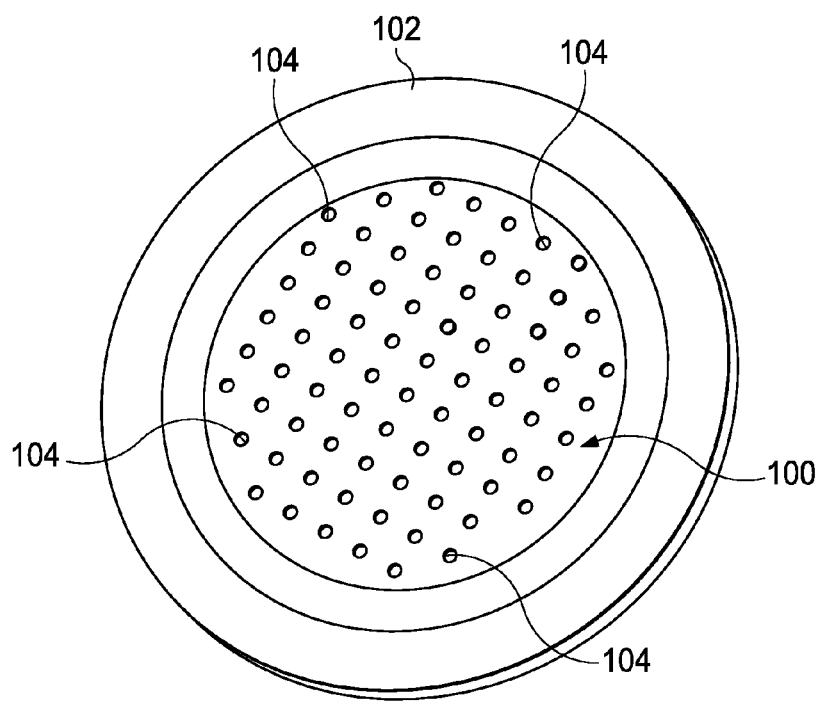
FIG. 5 is a top plan view of the die wafer and wafer ring of FIG. 4, in which each die portion has a central hole formed therein.

FIG. 5 is a top plan view of the die wafer 100 and wafer ring 102 of FIG. 4, in which each wafer portion that will ultimately become a die has a central hole 104 formed therein. Such holes 104 may be conventionally created by mechanical or laser drilling. The holes 104, in one example embodiment, extend through the entire thickness of the wafer 100.

Figure 6:
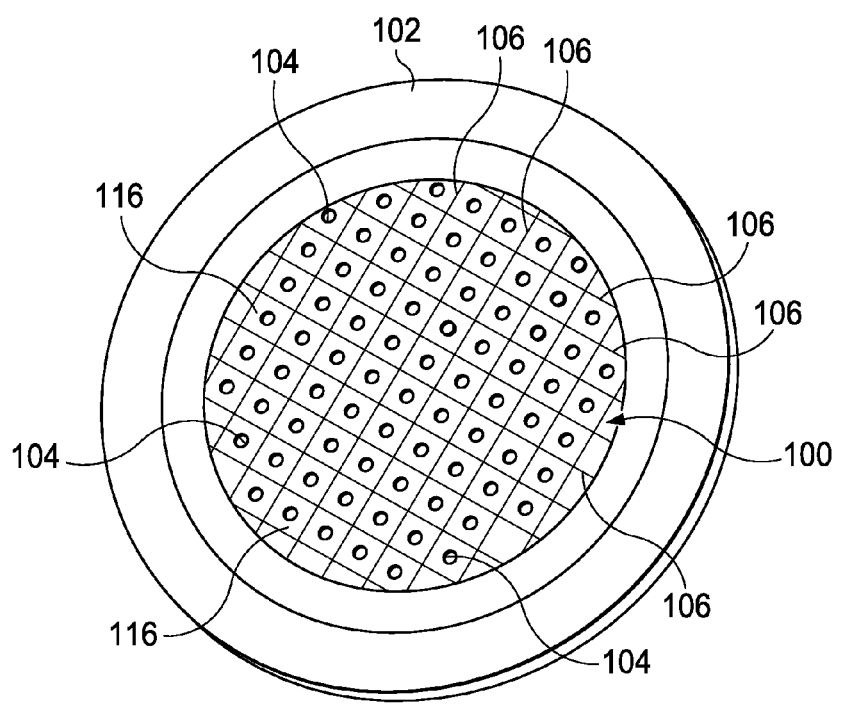
FIG. 6 is a top plan view of the die wafer and wafer ring of FIG. 5, after wafer singulation/dicing.

FIG. 6 is a top plan view of the die wafer 100 and wafer ring 102 of FIG. 5 after dicing (singulation). During singulation, the wafer 100 is singulated along saw streets 106 to separate the wafer into a plurality of individual dies 116, each having a hole 104 extending through it.

FIG. 7 is a top plan view of a lead frame 110 with one of the singulated dies 116 of FIG. 6 mounted on a die attachment pad (DAP) 112 of the lead frame 110. The leadframe 110 has a plurality of leads 114 positioned around the DAP 112.

FIG. 8 is a magnified isometric view of a portion of the die 116 of FIG. 7 containing a central hole 104. The hole 104 exposes a plurality of planar ground traces 122, 124, 126, and 128, which are arranged in parallel, spaced apart, stacked relationship within the die substrate.

FIG. 9 is the magnified view of FIG. 8 after the hole 104 has been filled with a conductive material 130, such as silver epoxy or other conductive filler material.

Figures 10, 11, 12:
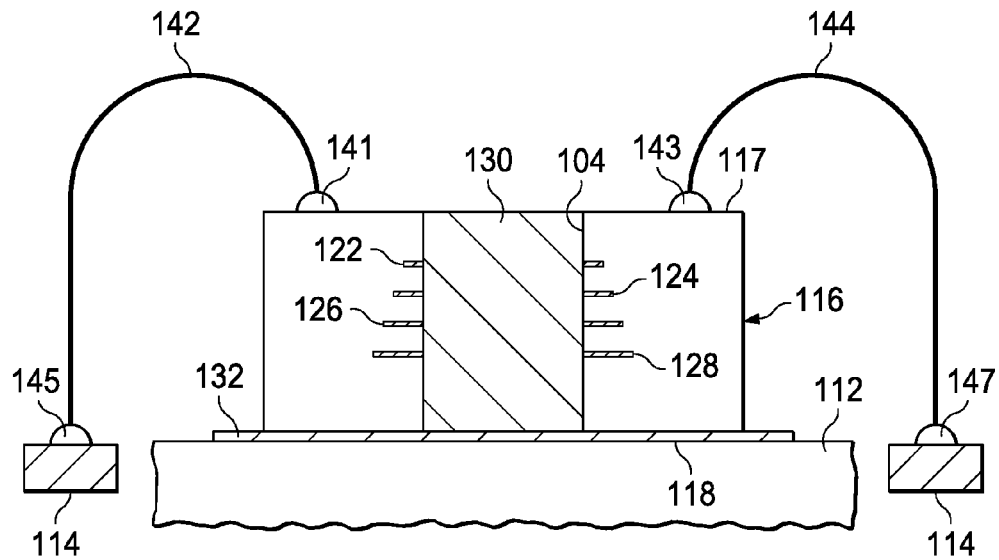
FIG. 10 is a cross-sectional view of the die and leadframe of FIG. 6.
FIG. 11 is a flow diagram of a method of making an integrated circuit assembly.
FIG. 12 is a flow diagram of a method of eliminating wire sweep between ground and signal wires in an integrated circuit package.

FIG. 10 is a cross sectional view of the die 116 and DAP 112 of FIG. 7, in which the hole 104 in the die 116 has been filled with conductive filler material 130. The filler material 130 electrically connects the ground traces 122, 124, 126, and 128. The filler material may be directly connected to the DAP 112 or it may be connected to the DAP by a layer of other conductive attachment material 132, such as conductive adhesive, solder or other conductive attachment material. In this embodiment the hole 104 extends entirely through the die 104, i.e., it extends through the top surface 117 and bottom surface 118 of the die. In other embodiments (not shown) the hole 104 and filler 130 extends up from the bottom surface 118 of the die sufficiently far to expose and connect all of the conductive traces 122, 124, 126, 128, but does not extend to the top surface 117 of the die. Bond wires 142, 144 have first ends thereof connected, as by ball bonds 141, 143, to electrical contact surfaces provided on the top surface 117 of the die 116 and have second ends thereof connected, as by stitch bonds 145, 147 to leads 114. There are no bond wires attached to the DAP 112.

As previously discussed, FIG. 2 is a top plan view of a die 66 that may be identical to die 116, which is attached to a leadframe 60 that may be identical to leadframe 110.

FIG. 10 is a flow diagram of a method of making an integrated circuit assembly. The method includes, as shown at block 301, exposing ground connection traces in an IC die by making a hole in the die that intersects the ground connection traces.

FIG. 11 is a flow diagram of a method of eliminating wire sweep between ground and signal wires in an integrated circuit package. The method comprises, as shown at block 401, providing a plurality of stacked ground connection traces in the die; and, as shown at block 402, forming a hole through the die to expose the ground connection traces.

Expressly disclosed in detail herein are embodiments of an integrated circuit (IC) die that includes a plurality of spaced apart ground connection traces positioned between a top surface and bottom surface of the die with a hole in the die that exposes the plurality of spaced apart ground connection traces. Methods of making such a die and various uses thereof in combination with a leadframe have also been expressly disclosed herein. Various alternative embodiments of this integrated circuit die and methods of making and using it may become obvious to those skilled in the art after reading this disclosure. It is intended that the appended claims be construed broadly to cover such alternative embodiments, except as limited by the prior art.

What is claimed is:

1. An integrated circuit (IC) die comprising:
  a top surface and a bottom surface; and
  a plurality of spaced apart ground connection traces positioned between said top surface and said bottom surface;
  wherein a hole in said die exposes said plurality of spaced apart ground connection traces.

2. The IC die of claim 1 further comprising conductive filler filling said hole and electrically connecting said plurality of ground connection traces.

3. The IC die of claim 2 wherein said hole extends through said top surface and said bottom surface.

4. An integrated circuit (IC) package comprising an IC die having a top surface and a bottom surface and a plurality of spaced apart ground connection traces positioned between said top and bottom surfaces; wherein a hole in said IC die exposes said ground connection traces.

5. The IC package of claim 4 further comprising conductive filler filling said hole and electrically connecting said ground connection traces.

6. The IC package of claim 4 wherein said hole in said IC die extends through said top surface and said bottom surface of said IC die.

7. The IC package of claim 5 wherein said IC die is mounted on a die attach pad (DAP) with said conductive filler in said hole electrically connected to said DAP.

8. A method of making an integrated circuit (IC) assembly comprising:
  exposing ground connection traces in an IC die by making a hole in the die that intersects the ground connection traces.

9. The method of claim 8 further comprising filling the hole with conductive filler.

10. The method of claim 9 further comprising attaching the die to a leadframe die attach pad (DAP) such that the conductive filler is electrically connected to the DAP.

11. The method of claim 8 wherein said exposing ground connection traces comprises extending the hole between top and bottom surfaces of the IC die.

12. The method of claim 10 further comprising wire bonding contact surfaces on a top surface of the die with leads of the leadframe and not the DAP.

13. The method of claim 12 further comprising encapsulating the die and leadframe in mold compound.

14. The method of claim 13 further comprising plating exposed surface portions of the leads.

15. The method of claim 12 further comprising singulating the encapsulated leadframe from adjacent encapsulated leadframes.

16. An integrated circuit (IC) package comprising:
  an IC die having a first surface and a second surface and a conductive material extending from the first surface to the second surface, the conductive material connected to a plurality of ground connection traces in the IC die; and
  a lead frame including a die attach pad and a set of leads, the die attach pad electrically connected to the conductive material.

17. The IC package of claim 16 further comprising a mold compound encapsulating portions of the IC die and the lead frame.

18. The IC package of claim 16, wherein the conductive material occupies a hole that extends from the first surface to the second surface, and wherein the hole includes a cylindrical shape.

19. The IC package of claim 16, wherein the plurality of ground connection traces are arranged in parallel and spaced apart relationship with each other.

20. The IC package of claim 16, wherein the conductive material includes silver epoxy.

* * * * *